(12) United States Patent
Deguchi et al.

(10) Patent No.: US 9,166,608 B1
(45) Date of Patent: Oct. 20, 2015

(54) METHOD AND CIRCUIT FOR BANDWIDTH MISMATCH ESTIMATION IN AN A/D CONVERTER

(71) Applicant: IMEC VZW, Leuven (BE)

(72) Inventors: Kazuaki Deguchi, Hyogo (JP); Bob Verbruggen, Kessel-lo (BE); Jan Craninckx, Boutersem (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/731,471

(22) Filed: Jun. 5, 2015

(30) Foreign Application Priority Data

Jun. 6, 2014 (EP) .................................. 14171580

(51) Int. Cl.
  *H03M 1/10* (2006.01)
  *H03M 1/06* (2006.01)
  *H03M 1/00* (2006.01)
  *H03M 1/46* (2006.01)
  *H03M 1/12* (2006.01)

(52) U.S. Cl.
  CPC ............ *H03M 1/0604* (2013.01); *H03M 1/002* (2013.01); *H03M 1/1071* (2013.01); *H03M 1/468* (2013.01); *H03M 1/00* (2013.01); *H03M 1/12* (2013.01); *H03M 2201/4233* (2013.01)

(58) Field of Classification Search
  CPC .. H03M 1/12; H03M 1/00; H03M 2201/4233
  USPC .................. 341/120, 123, 122, 166, 118, 155
  See application file for complete search history.

(56) References Cited

U.S. PATENT DOCUMENTS

| | | | |
|---|---|---|---|
| 7,916,051 B1 * | 3/2011 | Sestok et al. | ................... 341/120 |
| 8,248,282 B2 | 8/2012 | Payne et al. | |
| 2010/0207792 A1 | 8/2010 | Louwsma et al. | |
| 2013/0106631 A1 | 5/2013 | Petigny et al. | |
| 2013/0214946 A1 | 8/2013 | Verbruggen et al. | |

OTHER PUBLICATIONS

European Search Report, European Patent Application No. 14171580.5, dated Nov. 19, 2014.
Stepanovic, Dusan et al., "A 2.8 GS/s 44.6 mW Time-Interleaved ADC Achieving 50.9 dB SNDR and 3 dB Effective Resolution Bandwidth of 1.5 GHz in 65 nm CMOS", IEEE Journal of Solid-State Circuits, vol. 48, No. 4, Apr. 2013, pp. 971-982.
Tripathi, Vaibhav et al., "Mismatch Characterization of Small Metal Fringe Capacitors", Proceedings of the IEEE 2013 Custom Integrated Circuits Conference, Sep. 22, 2013, pp. 1-4.

(Continued)

*Primary Examiner* — Joseph Lauture
(74) *Attorney, Agent, or Firm* — McDonnell Boehnen Hulbert & Berghoff LLP

(57) ABSTRACT

Methods and devices herein relate to a method for estimating bandwidth mismatch in a time-interleaved A/D converter. An example method includes precharging terminals of capacitors to a first state in each channel of a plurality of channels and sampling a reference analog input voltage signal ($V_{ref}$) applied via a first switchable path whereby the sampled input voltage signal is received at first terminals of the capacitors. The method further includes setting the second terminals of each channel to a second state. The method also includes applying the reference analog input voltage signal to the first terminals via a second switchable path, and thereby creating on the first terminals a non-zero settling error. The method additionally includes quantizing the settling error to obtain an estimate of the non-zero settling error. The method yet further includes comparing the estimates of the non-zero settling errors and deriving an estimation of the bandwidth mismatch.

8 Claims, 9 Drawing Sheets

(56) References Cited

OTHER PUBLICATIONS

Satarzadeh, P. et al., "Adaptive Semiblind Calibration of Bandwidth Mismatch for Two-Channel Time-Interleaved ADCs", IEEE TCAS-I, vol. 56, No. 9, pp. 2075-2088, Sep. 2009.

Saleem, S. et al., "Adaptive Compensation of Frequency Response Mismatches in High-Resolution Time-Interleaved ADCs using a Low-Resolution ADC and a Time-Varying Filter", Proc. IEEE Int'l Symposium on Circuits and Systems (ISCAS) 2010, pp. 561-564.

* cited by examiner

METHOD AND CIRCUIT FOR BANDWIDTH MISMATCH ESTIMATION IN AN A/D CONVERTER

CROSS-REFERENCE TO RELATED APPLICATIONS

The present application is a non-provisional patent application claiming priority to European Patent Application No. 14171580.5 filed Jun. 6, 2014, the contents of which are hereby incorporated by reference.

FIELD OF THE DISCLOSURE

The present disclosure is generally related to the field of high speed analogue-to-digital converters.

BACKGROUND

In software defined radio an Analog-to-Digital converter (ADC) needs a speed of at least 200 MSamples/s and as much resolution as is feasible for a power budget of a few milliWatt, in order to simplify automatic gain control (AGC) and relax filtering requirements. In addition, since this ADC also needs to quantize much lower bandwidth standards, a dynamic solution is desirable.

For such high speed ADCs interleaving is widely used. In high speed interleaved ADCs the effective ADC sampling frequency is increased by operating multiple ADCs alternately. Moreover, fully dynamic interleaved ADCs are of a special interest, as their total power consumption is independent of the number of parallel channels and the speed requirements for each individual channel are relaxed. However, interleaved ADCs suffer in general from mismatches among channels, gain mismatch and bandwidth mismatch. DC offset and gain mismatch are frequency-independent and can thus easily be calibrated in the digital domain. On the other hand, bandwidth mismatch due to capacitance and resistance mismatch in each sampling network of the interleaved ADC is frequency dependent and requires complex algorithms to be calibrated digitally. Consequently, spurious tones caused by bandwidth mismatch limit the high frequency input performance of interleaved ADCs. By applying correction for bandwidth mismatches in the sampling network bandwidths these spurs can be reduced. However, bandwidth errors first need to be estimated to determine how much correction, either in the digital or the analog domain, should be applied.

Conventionally, in order to be able to observe bandwidth errors a high frequency input signal is required for generating errors due to bandwidth mismatch. In a background calibration scheme this high frequency input signal can be the signal to be quantized during normal operation. However, this requires certain assumptions about the nature of this input signal, some of which are not generally met. Additionally, applying a high frequency input requires an external signal generator, at the cost of valuable chip area and design time.

Bandwidth mismatch calibration requires a practical way to detect bandwidth mismatch. While applying a high frequency sine wave to the ADC input and observing an output spectrum obviously allows for identification of bandwidth mismatch, this detection method requires both an external stimulus and quite a lot of computation in the FFT to obtain the ADC output spectrum.

U.S. Pat. No. 8,248,282 describes an analog method for implementing a programmable bandwidth sampling network to calibrate for bandwidth mismatch. No bandwidth estimation method is however proposed.

In the paper "*Adaptive Semiblind Calibration of Bandwidth Mismatch for Two-Channel Time-Interleaved ADCs*" (P. Satarzadeh et al, IEEE TCAS-I, vol. 56, no. 9, pp. 2075-2088, September 2009) a method is proposed for detecting bandwidth mismatch errors by assuming (1) some signal content is present at the ADC input just below the Nyquist frequency, and (2) no signal content is present in a small area around DC. These conditions are not generally satisfied in communication input signals, in which oversampling typically results in very little signal content in the second half of the Nyquist band. As a result, the method of Satarzadeh is only applicable in a communications context if an explicit test signal is added to the signal to be quantized, at the cost of a power-hungry, linear summator and some ADC dynamic range.

Alternatively, the paper "*Adaptive Compensation of Frequency Response Mismatches in High-Resolution Time-Interleaved ADCs using a Low-Resolution ADC and a Time-Varying Filter*" (S. Saleem et al., Proc. IEEE Int'l Symposium on Circuits and Systems (ISCAS) 2010, pp. 561-564) describes a background method for measuring channel gain, DC offset and timing mismatch using a low resolution reference ADC. Advantageously, this allows for mismatch calibration without interrupting the ADC operation. However, the need for an additional low resolution ADC increases area, complexity and design time.

The solutions for bandwidth mismatch detection described in both above-mentioned papers however suffer from the drawback that significant additional analog circuits are required (analog signal conditioning and a redundant reference ADC, respectively) and that a significant amount of digital calculation is needed. They are thus not applicable in a low power design.

Hence, there is a need for solutions for bandwidth mismatch in a time-interleaved A/D converter that are computationally simple and do not require additional hardware.

SUMMARY

Embodiments of the present disclosure provide for a method for estimating bandwidth mismatch in a time-interleaved A/D converter and for a time-interleaved A/D converter adapted for applying the method, whereby no additional analog circuits are needed and only a moderate amount of calculation in the digital domain is required.

The above objective is accomplished by the solution according to the present disclosure.

In a first aspect the disclosure relates to a method for estimating bandwidth mismatch in a time-interleaved A/D converter comprising a plurality of channels, each channel comprising sampling means for sampling a reference analog input voltage signal, an array of capacitors connected in parallel and a quantizer arranged for converting the sampled input voltage at first terminals of the capacitors into a digital code. The method includes:
  precharging second terminals of the capacitors of the plurality of channels to a first state and sampling the reference analog input voltage signal, whereby the reference analog input voltage signal is applied via a first switchable path and the sampled input voltage signal is received at first terminals of the capacitors,
  setting in each channel the second terminals to a second state, thereby generating a further reference voltage signal at the first terminals,
  applying the reference analog input voltage signal to the first terminals of the capacitors via a second switchable path, the second path having a given impedance being higher than the impedance of the first path, thereby creating on the first terminals a non-zero settling error indicative of an incomplete transition from the further reference voltage signal to the reference analog input voltage signal, quantizing the non-zero settling error, thereby obtaining an estimate of the non-zero settling error in each channel of the plurality, and comparing the estimates of the non-zero settling errors of the channels and deriving therefrom an estimation of the bandwidth mismatch.

The proposed solution indeed allows for obtaining an estimated bandwidth mismatch based on the estimated settling errors. The bandwidth of each channel is determined by the capacitance value of the array of capacitors and the series impedance of the sampling means, both of which also affect the settling behavior when the reference analog input is applied through the second switchable path. As a result, when the estimated settling error matches for all channels of the plurality of channels, it can be assumed that these channels also have a matching bandwidth.

In an example embodiment, the second switchable path is in parallel to the first switchable path.

In another aspect the disclosure relates to a time-interleaved analog-to-digital, A/D, converter arranged for receiving a reference analog input voltage signal and comprising a plurality of channels each including:

sampling means for sampling the reference analog input voltage signal yielding a sampled input voltage signal, an array of capacitors connected in parallel and arranged for receiving the sampled input voltage signal at first terminals of the capacitors, and a quantizer arranged for converting the sampled input voltage at the first terminals into a digital code, characterized in that the reference analog input voltage signal can be applied to the sampling means of the plurality of channels via a first switchable path or via a second switchable path, the second path having a given impedance being higher than the impedance of the first path and in that the time-interleaved A/D converter includes a control unit arranged for precharging second terminals of the capacitors of the plurality of channels to a first state, for switching in each channel the second terminals from the first state to a second state, for controlling the first and the second switchable path and for comparing estimates of non-zero settling errors of the channels and for deriving therefrom an estimation of the bandwidth mismatch.

In an example embodiment, the second switchable path is in parallel to the first switchable path.

In an example embodiment, the array of capacitors is part of a digital-to-analog converter (DAC). Many ADC architectures contain a DAC.

In an example embodiment, the time-interleaved A/D converter is implemented in a differential way.

In one embodiment the second switchable path is connected between the differential inputs of the sampling means of the plurality of channels.

In another embodiment each channel of the plurality comprises a first and a second Successive Approximation Register, SAR, whereby the second SAR has a higher resolution than the first SAR.

For purposes of summarizing the disclosure and the advantages achieved over the prior art, certain objects and advantages of various devices, systems, and methods have been described herein above. Of course, it is to be understood that not necessarily all such objects or advantages may be achieved in accordance with any particular embodiment of the disclosure. Thus, for example, those skilled in the art will recognize that the devices and methods herein may be embodied or carried out in a manner that achieves or optimizes one advantage or group of advantages as taught herein without necessarily achieving other objects or advantages as may be taught or suggested herein.

The above and other aspects of the disclosure will be apparent from and elucidated with reference to the embodiment(s) described hereinafter.

BRIEF DESCRIPTION OF THE FIGURES

Various methods and devices will now be described further, by way of example, with reference to the accompanying drawings, wherein like reference numerals refer to like elements in the various figures.

DETAILED DESCRIPTION

Figure 1:
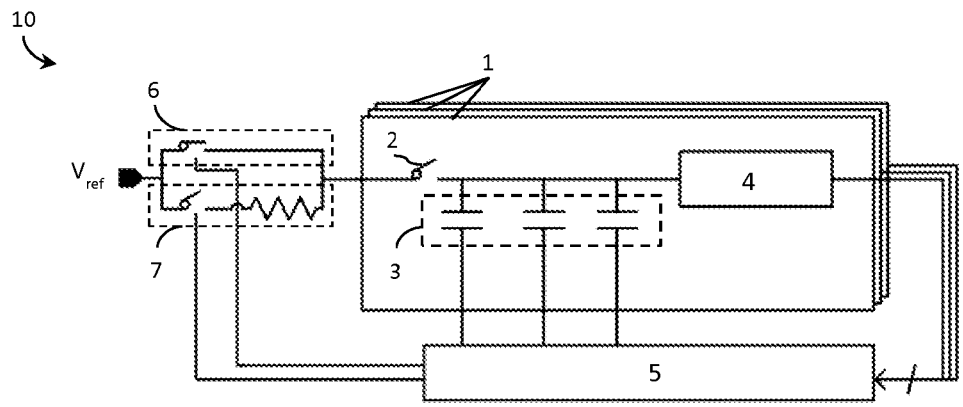
FIG. 1 illustrates a time-interleaved ADC according to an example embodiment.

The present disclosure describes particular embodiments and with reference to certain drawings. However, the disclosure is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various described aspects. This method of disclosure, however, is not to be interpreted as reflecting an intention that the described devices and methods require more features than are expressly recited in each claim. Rather, as the following claims reflect, described aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

It should be noted that the use of particular terminology when describing certain features or aspects of the disclosure should not be taken to imply that the terminology is being re-defined herein to be restricted to include any specific characteristics of the features or aspects of the disclosure with which that terminology is associated.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Bandwidth mismatch occurs due to mismatch in the on-resistance of the channel sampling switch and/or the capacitance value of the sampling capacitor, which causes amplitude and phase errors at high input frequencies. Designing the sampling network for intrinsic matching is complicated by the fact that the sampling capacitors are not necessarily located in close proximity in layout, meaning that typical foundry matching data is unreliable. In the proposed design this potential issue is avoided by adjusting the channel time constant. Channel bandwidth mismatch is detected using the proposed settling error detection method.

A time-interleaved ADC 10 according to the present disclosure is illustrated in FIG. 1. A reference analog input voltage signal $V_{ref}$ is applied to the various channels 1 of the ADC. Each channel is provided with sampling means 2 to sample the applied analog signal. In each channel there is an array of capacitors 3 connected in parallel, for example a capacitive DAC as used in many ADC architectures. The capacitors receive at their first terminal the sampled input voltage $V_{ref}$. In each channel a quantizer 4 converts the sampled input voltage into a digital representation of the input voltage. The reference analog input voltage signal can be applied to the plurality of channels 1 via two possible switchable paths. The first path 6 has a certain impedance. The second path 7 is in parallel with the first path and has a known impedance higher than that of the first path. The time-interleaved A/D converter further contains a control unit 5. This control unit is capable of precharging second terminals of the capacitors to a first state and controls the sampling of the reference analog input voltage signal, whereby the reference analog input voltage signal is applied via the first switchable path and the sampled input voltage signal is received at first terminals of the capacitors. As illustrated in FIG. 1 the control unit 5 is adapted for setting in each channel the second terminals of the capacitors to a second state, whereby a further reference voltage signal $V_{diff}$ is generated at the first terminals. The control unit also takes care of performing the comparison of the estimated settling errors of the various channels and of deriving the bandwidth mismatch estimation.

Figure 2:
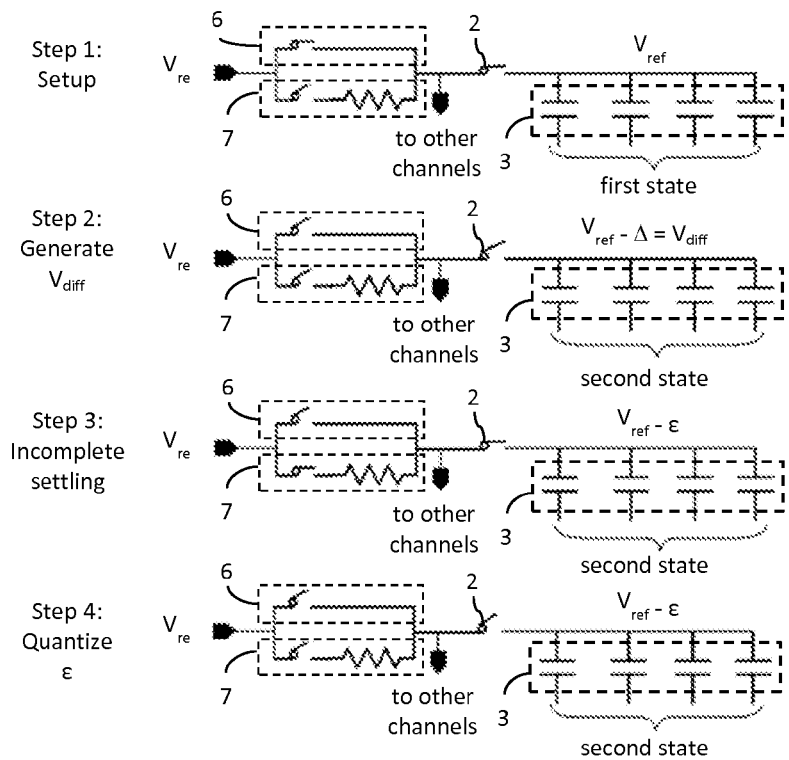
FIG. 2 illustrates an embodiment of the estimation method according to an example embodiment.

The detection of bandwidth mismatch according to this disclosure is based on settling error detection. It leverages the capacitive DAC array present in many ADC architectures for residue generation. FIG. 2 illustrates the detection of a channel time constant mismatch in an automated calibration procedure. The calibration procedure only requires a static non-moving reference input signal. Only simple operations like additions and comparisons are needed in the digital domain.

As shown in FIG. 2, second terminals of the capacitors 3 of each channel 1 are precharged to a first state and the reference analog input voltage signal, which is applied via a first switchable path 6, is sampled. Note that for convenience only for one channel the capacitors are shown in the figures. The sampled input voltage signal is received at first terminals of the capacitors. In each channel the second terminals are then set to a second state, thereby generating a further reference voltage signal $V_{diff}$ at the first terminals. Next, the reference analog input voltage signal is applied to first terminals of the capacitors via a second switchable path 7. As already mentioned, the second path has a given impedance higher than the impedance of the first path. On the first terminals a non-zero settling error ϵ is so created, indicative of an incomplete transition from the further reference voltage signal $V_{diff}$ to the reference analog input voltage signal $V_{ref}$. This settling error ϵ is then quantized, so obtaining an estimate of the settling error in each channel. By comparing the quantized settling errors of different channels an estimation of the bandwidth mismatch is derived.

Figure 3:
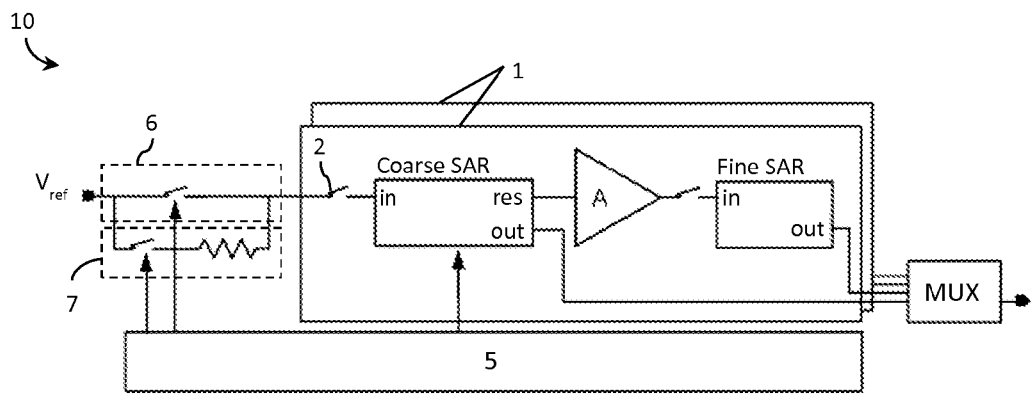
FIG. 3 illustrates a block diagram of an example embodiment.

In an embodiment each ADC channel 1 comprises a 6b coarse Successive Approximation register (SAR), a complementary dynamic residue amplifier A and a 10b fine SAR, as shown in the two-channel example of FIG. 3. Two 1b redundancies, between coarse and fine SAR and between the first 8 and last 2 cycles of the fine SAR respectively, result in 14b quantization. A front-end sampling switch 2 eliminates time skew. In this embodiment, the sampling switch 2 may act as the first switchable path as explained above.

Figure 4:
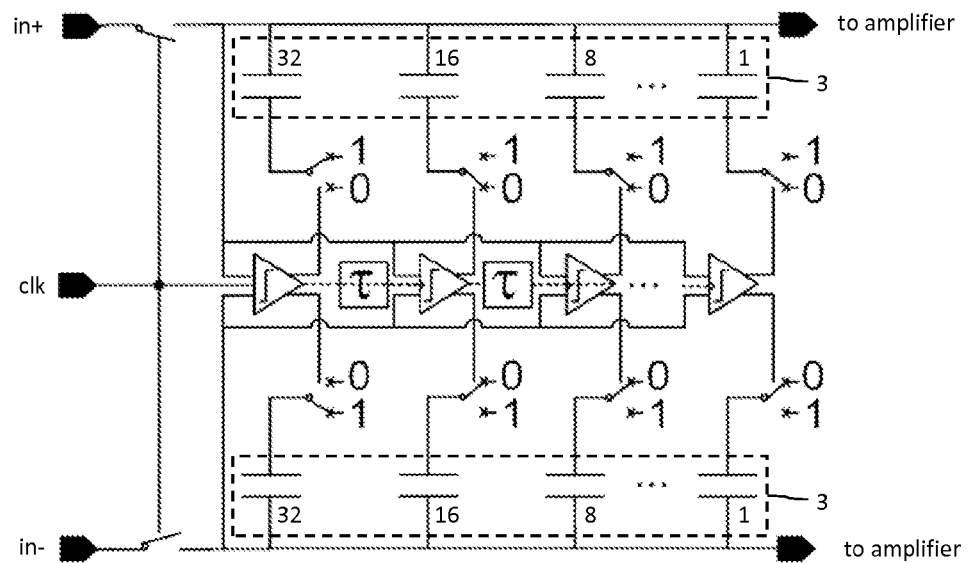
FIG. 4 illustrates a simplified SAR diagram of the embodiment of FIG. 3.

In an example embodiment, a fully differential ADC implementation is adopted. In this embodiment both coarse and fine SAR are comparator-controlled to eliminate the need for a SAR controller by using 6 and 10 different comparators in coarse and fine stages, respectively. Both SARs are arranged to directly generate DAC feedback and asynchronously clock the next comparator in line as illustrated in FIG. 4. The coarse DAC uses single-ended switching. Note that the coarse DAC comprises the array of capacitors as shown e.g. in FIG. 2. In a normal operation, during signal tracking, both MSB capacitors are precharged to a positive reference, logic 1, while the rest of the DAC capacitors are switched to a negative reference, logic 0. Depending on the MSB comparator output either the positive or negative MSB capacitor is switched down. Similarly, the coarse LSB capacitors are switched up depending on the LSB comparator outputs. As a result, the reference analog voltage, i.e. a common-mode voltage $V_{cm}$ at the input of the residue amplifier A is approximately the same as the voltage at the ADC input (in+,in−). This allows the use of a complementary residue amplifier. The default initial state of the capacitive DAC, as shown in FIG. 4, is two differential MSB capacitors precharged to a positive reference and the other differential capacitors precharged to a negative reference.

Figure 5:
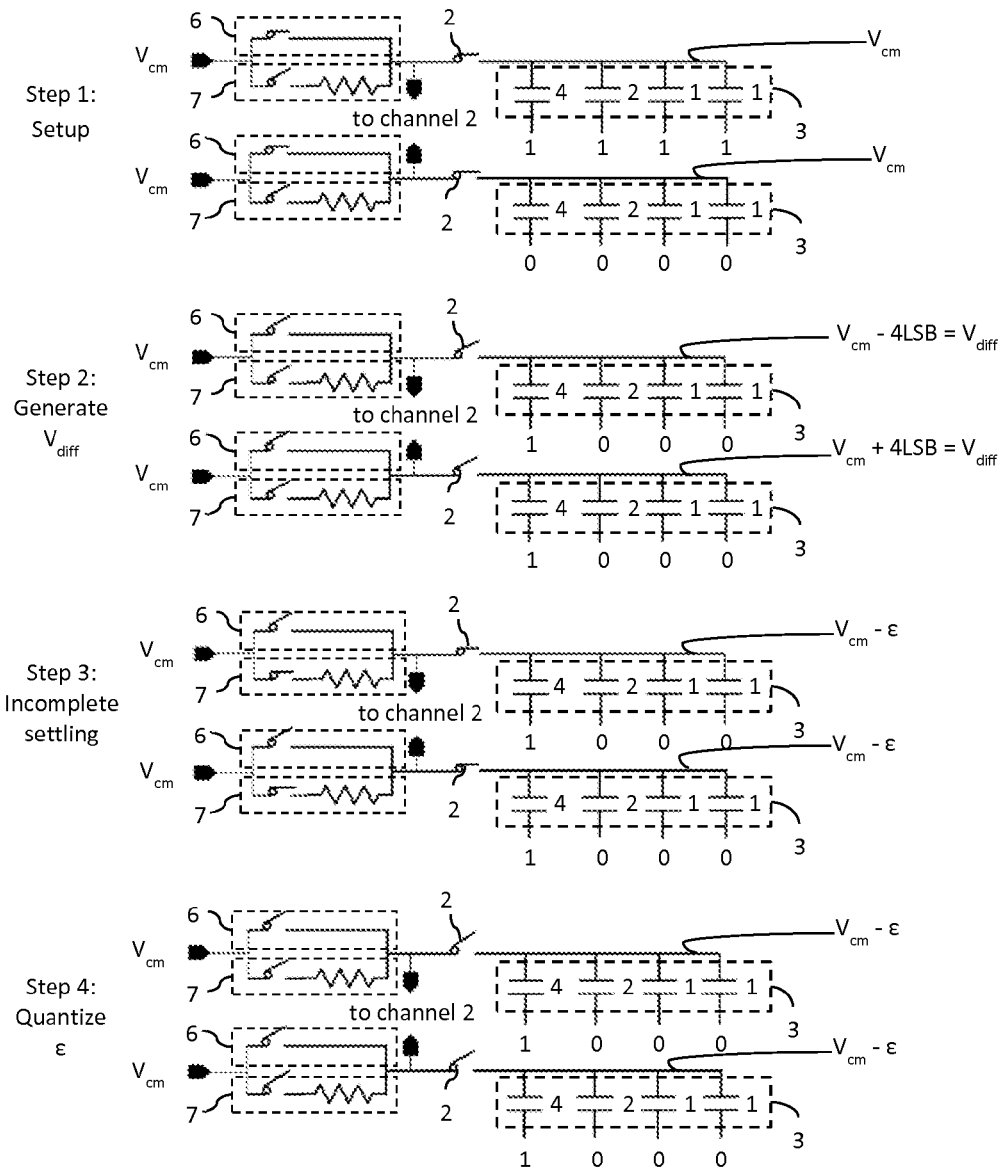
FIG. 5 represents the proposed estimation method according to an example embodiment.

The proposed estimation method will be now explained in details with reference to FIG. 5 showing an embodiment of a differential ADC implementation. First, in step 1 the ADC input common mode $V_{cm}$ is sampled on the coarse DAC array, with its bottom plates on the positive differential side all pre-charged to the positive reference (i.e. 1111), while the bottom plates on the negative differential side are all pre-charged to the negative reference (i.e. 0000). In this step the DAC array is precharged to a state different from the above-described default initial state (i.e. 1000) as in a normal ADC operation. This state of the DAC array is referred to as an imbalance state. In the second step the bottom plates of the DAC array capacitors are switched to the default initial condition of the DAC array, with the differential MSB capacitor at the positive reference and the other differential capacitors at the negative reference (i.e. 1000). This generates a voltage difference on the DAC top plates, i.e. $V_{diff}=V_{cm}-4VLSB$. In the third step the DAC top plates are connected to the zero differential input $V_{cm}$ through a redundant front-end switch with some explicit resistance in series, which forms the above-mentioned second switchable path 7. Because of the time constant created by the overall impedance of the second switchable path, the channel sampling switches and the channel sampling capacitor, a settling error ϵ is created on the DAC top plates which can then be quantized by normal ADC operation as shown in step 4. The quantized difference in settling error between channels can be used to estimate their difference in settling error and thus to estimate the bandwidth mismatch. The bandwidth mismatch estimation method as described only requires simple digital operations and a shorted ADC input (i.e. a zero differential ADC input), avoiding high frequency calibration signals and complex signal processing.

The series resistance in the second switchable path is required to ensure that a sufficiently large settling error is available for performing the quantization in step 4. The value of this resistance obviously also affects the size of the settling error, but since typically the same resistance is used for all channels, this is a common factor in all measurements. The period of time spent in step 3 should also be sufficiently short so that a sufficiently large settling error remains to be quantized.

Figure 6:
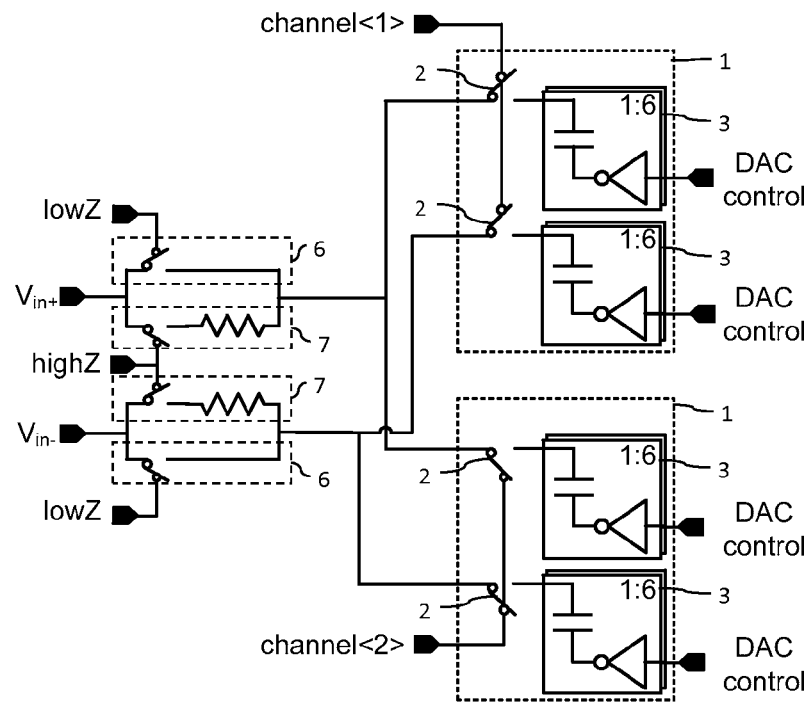
FIG. 6 illustrates a sampling network for the example embodiment of FIG. 3.

A detailed schematic of the operation of the differential sampling network is shown in FIG. 6. The sampling switches 2 of the two interleaved channels are controlled by signals channel<1> and channel<2>, respectively. A low clock signal closes these switches, while a high clock signal opens them. The first and second switchable paths are controlled by signals lowZ and highZ respectively, using similar logic levels: low clock signals are required to close the respective switches and high signals to open them. The switch in path 6 controlled by lowZ is also used to eliminate the impact of time skew on channel<1> and channel<2> when the ADC is quantizing a high frequency unknown input. The proposed bandwidth error estimation method then simply requires appropriate control of states of the capacitive the DAC array, i.e. generation of channel<1>, channel<2>, lowZ and highZ signals. This can be done using the controller described below.

Figure 7A:
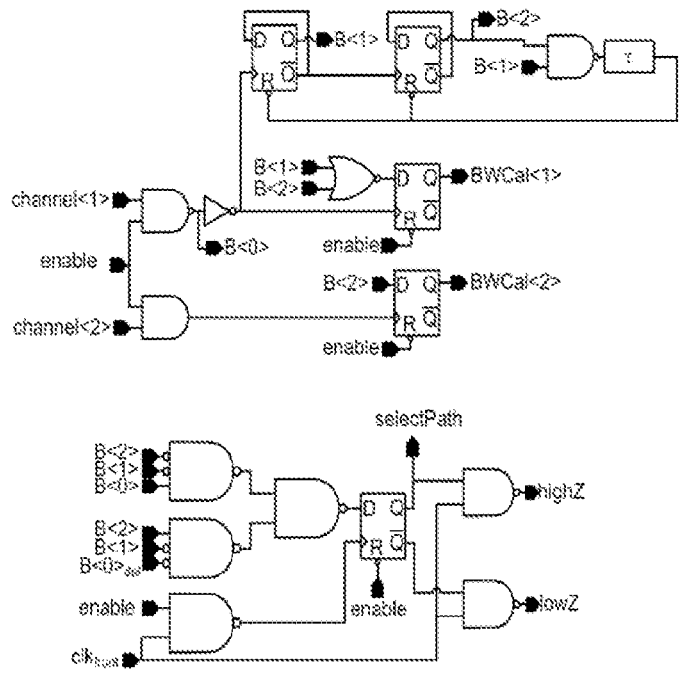
FIG. 7A illustrates a control unit according to an example embodiment.
Figure 7B:
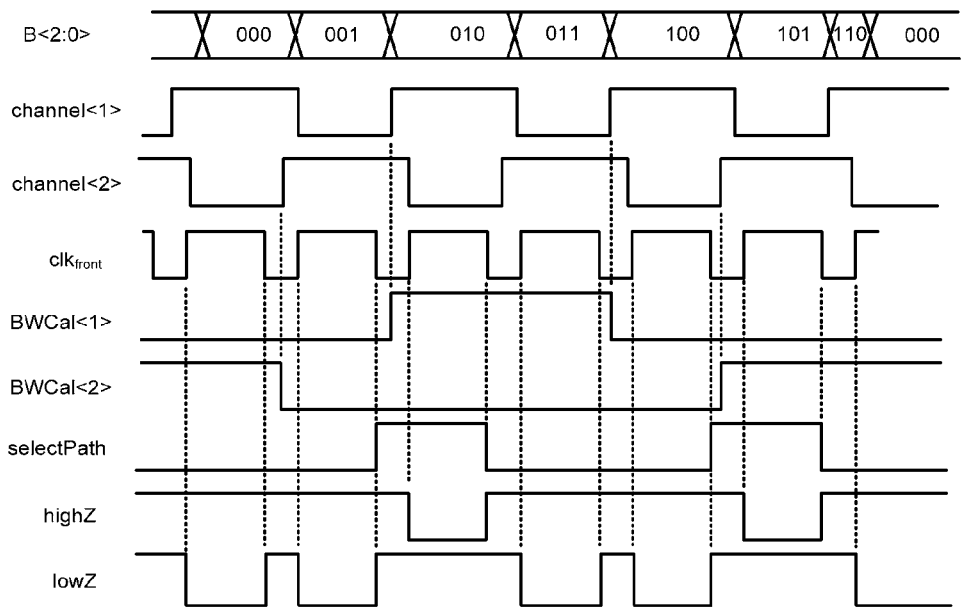
FIG. 7B illustrates clock waveforms according to an example embodiment.

An exemplary implementation of a controller and its waveforms for the time-interleaved ADC of FIG. 3 are shown in FIGS. 7A and 7B, respectively. The controller generates alternating lowZ and highZ clocks which are used to select either the first or the second switchable path, as well as signals BWCal<1> and BWCal<2>, which determine the DAC states. Specifically, when BWCal<i> is low, the DAC bottom plates in channel i are set to their default values, suitable for quantization of the coarse SAR. When BWCal<i> is high, the DAC bottom plates are in the imbalanced state described above. All clocks for the controller are gated with an enable signal which powers down the circuitry when not in use. The channel<1> signal clocks a counter with an asynchronous reset which implements a divide by three. When combined with the half rate channel<1> signal, a divide by six compared to the master clock is implemented. The state of this counter is expressed using a three bit value B<2:0>.

When the counter is in the "00X" state and a rising edge arrives on channel<1>, the BWCal<1> signal is brought high. Similarly, if the counter is in "1XX" state and a rising edge arrives on channel<2> the BWCal<2> signal is brought high. These two signals ensure that the ADC channels are set to their appropriate states during the setup step of FIG. 5. The selectPath signal is brought high if a falling edge of $clk_{front}$ occurs when the counter is in either the "001" state or the "100" state. This signal is then combined with the $clk_{front}$ signal to clock either the low or high impedance front-end switches through signals lowZ and highZ, at the appropriate times during time constant calibration. To avoid short pulses on the input of the highZ flipflop during transitions from state "101" to "110", a small delay is added to the inverted B<0> input of this logic path. This delay ensures that the rising edge of this inverted B<0> arrives after the falling edge of the inverted B<1>.

Figure 9:
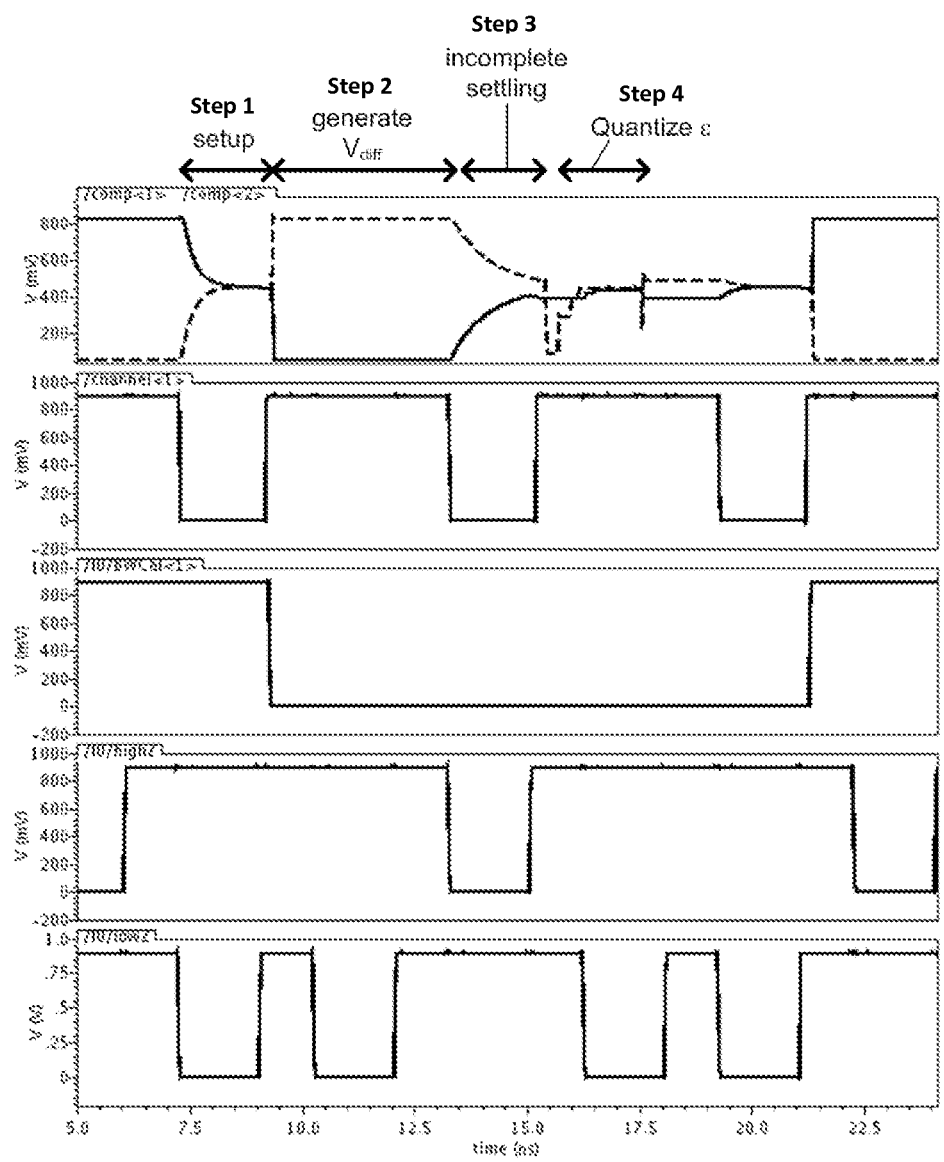
FIG. 9 represents a simulation of settling error detection for channel 1 only according to an example embodiment.

A simulation of the operation of this controller is shown in FIG. 9 for channel 1. Channel 2 waveforms are similar, but obviously out of phase. In this simulation, comp<1> and comp<2> are the voltages on the top plates of the DAC. When signals channel<1> and lowZ are both low and BWCal<1> is high the circuit is in step 1 described in FIG. 5. The common mode voltage is connected to the DAC top plates through the low impedance path, and since BWCal<1> is high the DAC bottom plates are in an imbalanced state. After channel<1> and lowZ have been brought high, BWCal<1> goes to zero, which sets the DAC bottom plates to their default initial states, generating a voltage step on comp<1> and comp<2>. Next, channel<1> is brought low along with the highZ signal, connecting the DAC top plates to the common-mode input voltage through the high impedance path and the DAC top plate voltage starts slowly settling to the common-mode value. After a predetermined time the highZ and channel<1> signals are brought high, disconnecting the DAC top plates from the input and sampling the remaining error. This also starts the quantization of the ADC, which in this embodiment corresponds to a successive approximation on the DAC top plates, as shown in FIG. 9.

Figure 8:
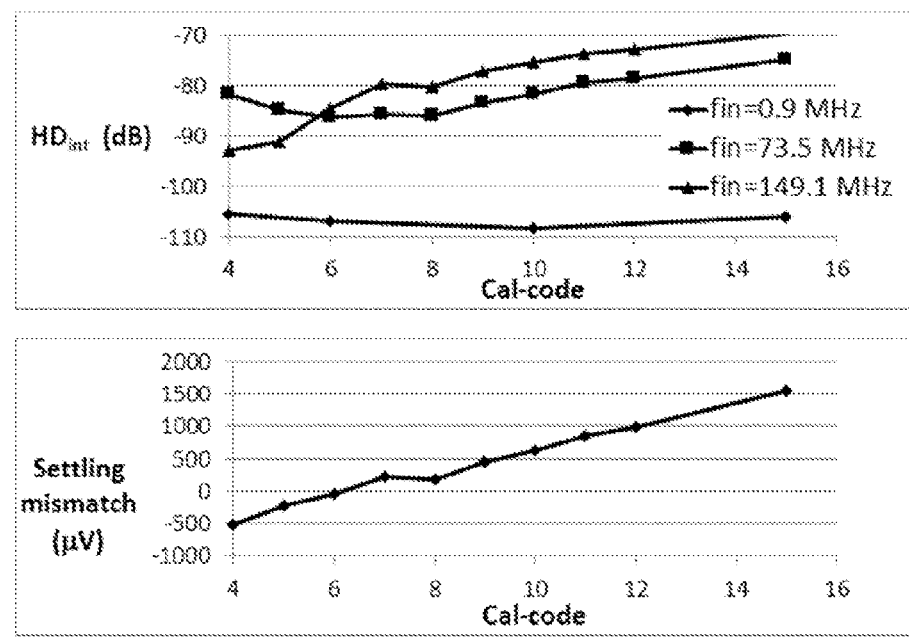
FIG. 8 illustrates simulated distortion due to bandwidth mismatch (top) and settling error mismatch (bottom) vs. channel bandwidth calibration code according to an example embodiment.

The variation of distortion as a result of bandwidth mismatch and the measured settling error as a function of the calibration setting of the channel switch are shown in FIG. 8. A settling error mismatch of 0 results in channel bandwidth mismatch spurs below −80 dB, which is the optimal setting when considering worst-case performance.

Figure 10:
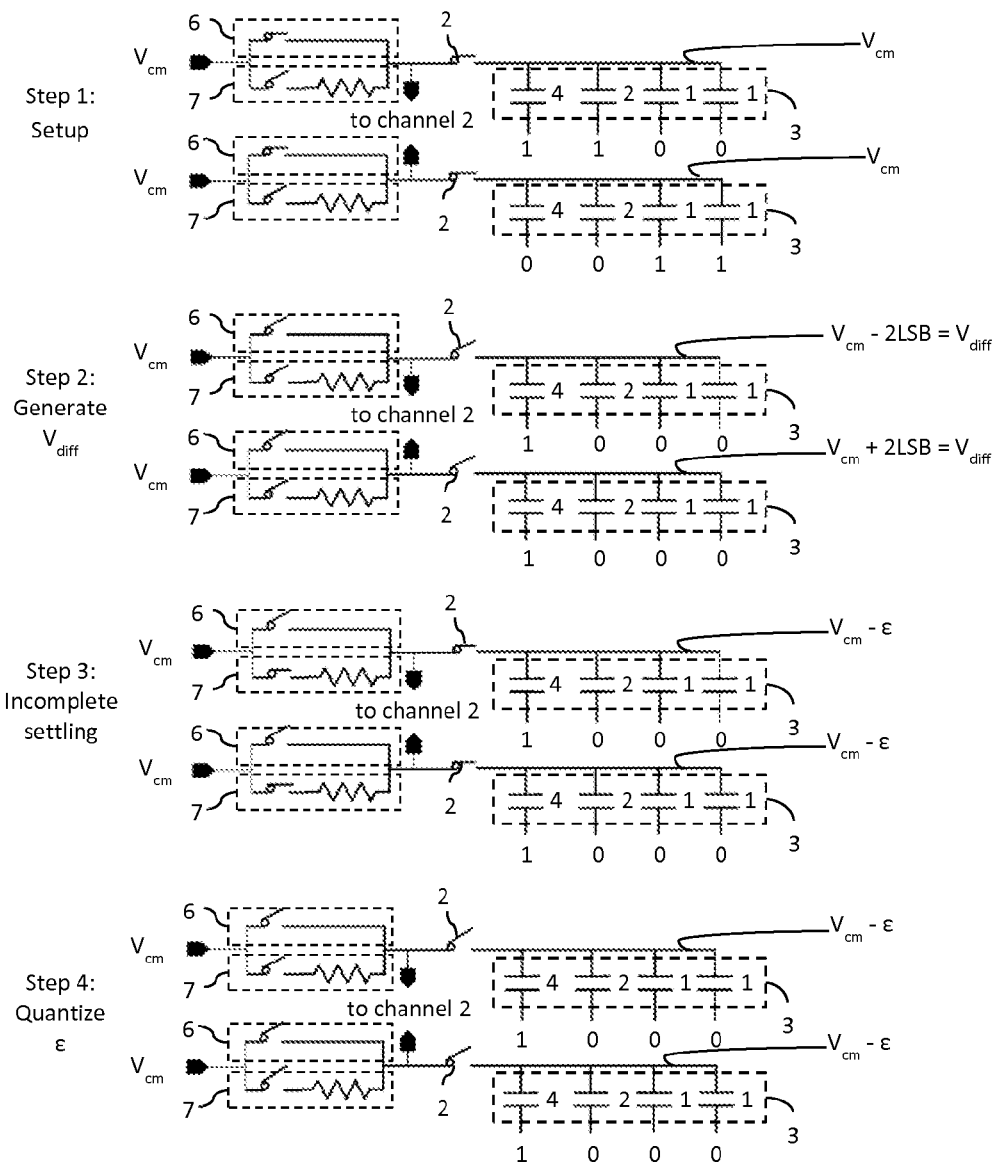
FIG. 10 illustrates an example embodiment of the estimation method.

In the embodiment shown in FIG. 5 the differential DAC bottom plates during the setup step (step 1) are fully imbalanced, with one differential side fully connected to the positive reference and the other fully connected to the negative reference, but other options are available for the first state of the DAC capacitors. For example, in another embodiment in step 1 the DAC bottom plates may be partially imbalanced, as illustrated in FIG. 10. Bottom plates of the differential DAC array 3 are set initially to 1100 and 0011, respectively.

Figure 11:
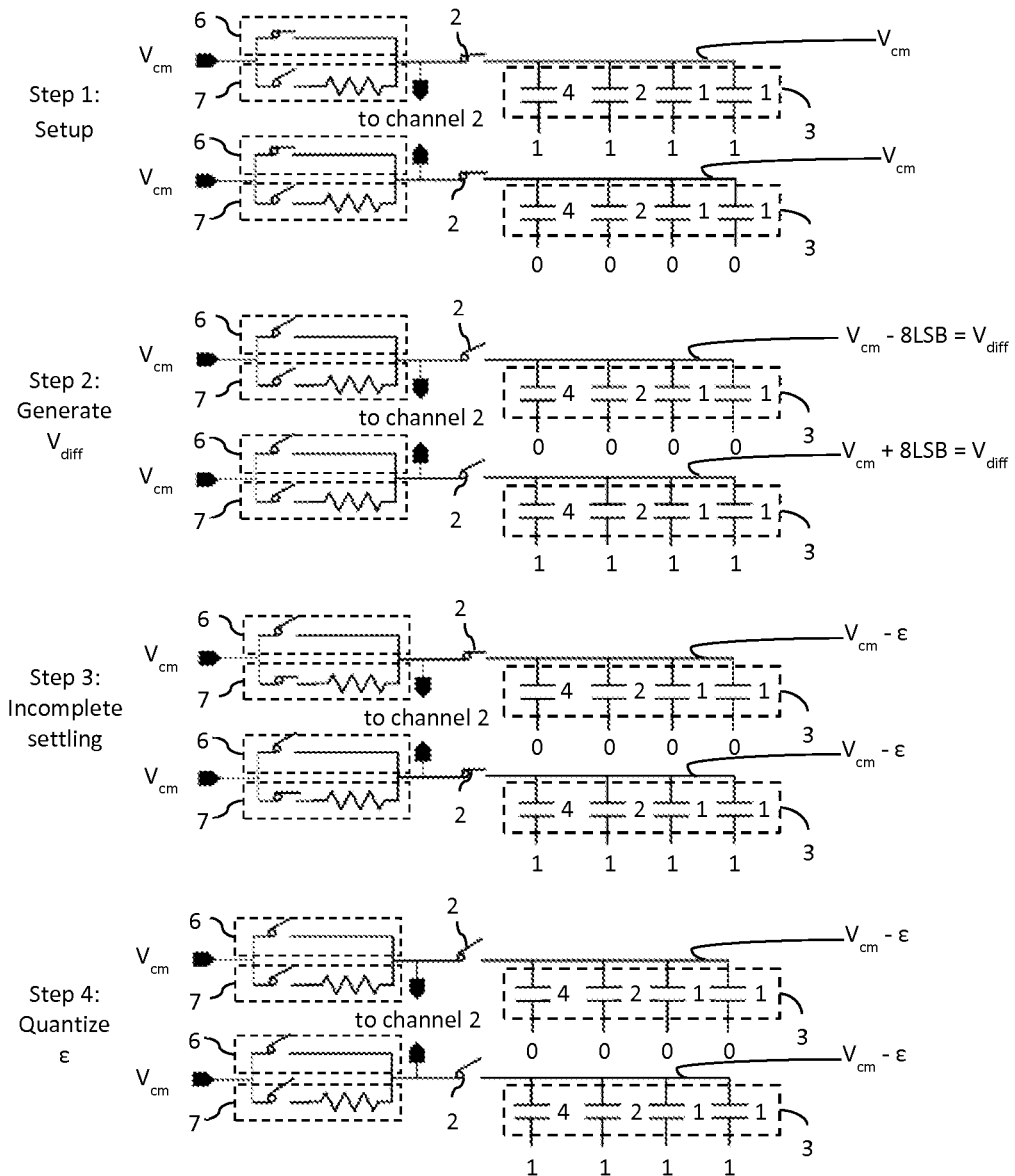
FIG. 11 illustrates an example embodiment of the estimation method.

In the embodiments shown in FIG. 5 and FIG. 10 the differential DAC bottom plates return to their default initial condition when the differential voltage $V_{diff}$ is generated in the second step. While this ensures the coarse SAR can operate as normal during quantization of the settling error, other solutions for the second state of the DAC capacitors are possible. Indeed, if the generated settling error is sufficiently small, it can be quantized using only the fine SAR in the ADC architecture of FIG. 3. This allows the second state of the coarse DAC no longer to be in its default initial state at the start of quantization, i.e. 1000 as shown in FIG. 5 and FIG. 10. FIG. 11 shows an example of a possible second state, with bottom plates of the differential coarse DAC array set to 0000 and 1111, respectively. This is possible if the quantization step (step 4) is done while skipping the coarse quantization and using only the fine quantization step.

Figure 12:
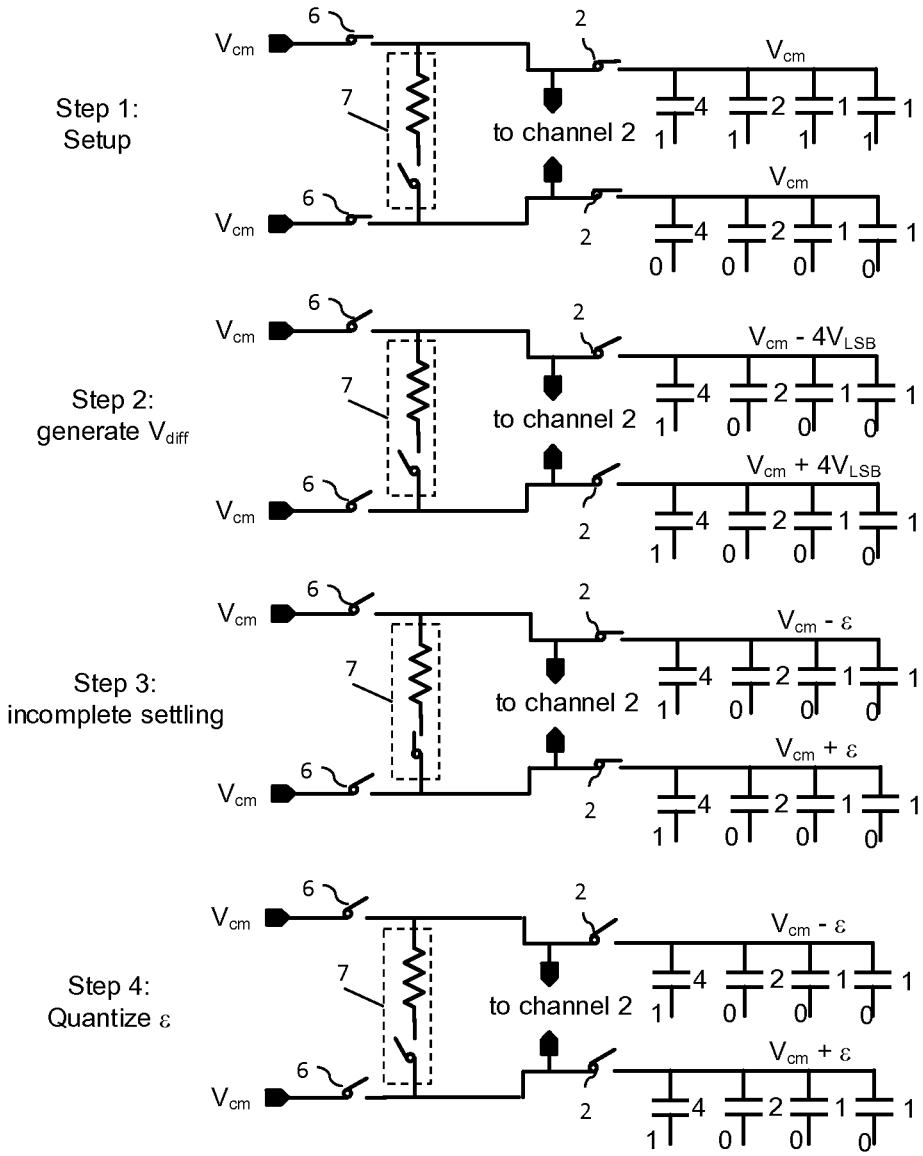
FIG. 12 illustrates a time-interleaved A/D converter according to an example embodiment.

In the embodiments described above, the second (high impedance) path is placed in parallel to the first path (low impedance) path. However, in a differential implementation, the second path may be connected in parallel to the input of the differential sampling means 2, as shown in FIG. 12.

While the disclosure has been illustrated and described in detail in the drawings and foregoing description, such illustration and description are to be considered illustrative or exemplary and not restrictive. The foregoing description details certain embodiments. It will be appreciated, however, that no matter how detailed the foregoing appears in text, the described methods and apparatus may be practiced in many ways. The disclosure is not limited to the embodiments explicitly described herein.

Other variations to the disclosed embodiments can be understood and effected by those skilled in the art from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. A method for estimating bandwidth mismatch in a time-interleaved A/D converter comprising a plurality of channels, each channel comprising sampling means for sampling a reference analog input voltage signal ($V_{ref}$), an array of capacitors connected in parallel and a quantizer arranged for converting the sampled input voltage at first terminals of the capacitors into a digital code, the method comprising:

precharging second terminals of the capacitors of the plurality of channels to a first state and sampling the reference analog input voltage signal, whereby the reference analog input voltage signal is applied via a first switchable path and the sampled input voltage signal is received at first terminals of the capacitors, setting in each channel the second terminals to a second state, thereby generating a further reference voltage signal ($V_{diff}$) at the first terminals, applying the reference analog input voltage signal to the first terminals of the capacitors via a second switchable path, the second path having a given impedance being higher than the known impedance of the first path, thereby creating on the first terminals a non-zero settling error indicative of an incomplete transition from the further reference voltage signal to the reference analog input voltage signal, quantizing the non-zero settling error, thereby obtaining an estimate of the non-zero settling error in each channel of the plurality, comparing the estimates of the non-zero settling errors of the channels and deriving therefrom an estimation of the bandwidth mismatch.

2. The method for estimating bandwidth mismatch of claim 1, wherein the second switchable path is in parallel to the first switchable path.

3. A time-interleaved analog-to-digital, A/D, converter arranged for receiving a reference analog input voltage signal ($V_{ref}$) and comprising a plurality of channels each comprising:

sampling means for sampling the reference analog input voltage signal yielding a sampled input voltage signal, an array of capacitors connected in parallel and arranged for receiving the sampled input voltage signal at first terminals of the capacitors, a quantizer arranged for converting the sampled input voltage at the first terminals into a digital code, wherein the reference analog input voltage signal can be applied to the sampling means of the plurality of channels via a first switchable path or via a second switchable path, the second path having a given impedance being higher than the known impedance of the first path, and wherein the time-interleaved A/D converter comprises a control unit arranged for precharging second terminals of the capacitors of the plurality of channels to a first state, for switching in each channel the second terminals from the first state to a second state, for controlling the first and the second switchable path and for comparing estimates of non-zero settling errors of the channels and for deriving therefrom an estimation of the bandwidth mismatch.

4. The time-interleaved A/D converter of claim 3, wherein the second switchable path is in parallel to the first switchable path.

5. The time-interleaved A/D converter of claim 3, wherein the array of capacitors comprises at least a portion of a Digital-to-Analog Converter.

6. The time-interleaved A/D converter of claim 3, implemented differentially.

7. The time-interleaved A/D converter of claim 6, whereby the second switchable path is connected between differential inputs of the sampling means of the plurality of channels.

8. The time-interleaved A/D converter of claim 3, wherein each channel of the plurality comprises a first and a second Successive Approximation Register, SAR, the second SAR having a higher resolution than the first SAR.

* * * * *